(12) United States Patent
Song et al.

(10) Patent No.: US 7,224,026 B2
(45) Date of Patent: May 29, 2007

(54) NANOELECTRONIC DEVICES AND CIRCUITS

(75) Inventors: Amin Song, Manchester (GB); Pär Omling, Lund (SE)

(73) Assignee: The University of Manchester, Manchester (GB)

( * ) Notice: Subject to any disclaimer, the term of this patent is extended or adjusted under 35 U.S.C. 154(b) by 108 days.

(21) Appl. No.: 10/475,347

(22) PCT Filed: Apr. 18, 2002

(86) PCT No.: PCT/GB02/01807

§ 371 (c)(1),
(2), (4) Date: Mar. 26, 2004

(87) PCT Pub. No.: WO02/086973

PCT Pub. Date: Oct. 31, 2002

(65) Prior Publication Data

US 2004/0149679 A1   Aug. 5, 2004

(30) Foreign Application Priority Data

Apr. 20, 2001   (GB) ................................. 0109782.3

(51) Int. Cl.
*H01L 29/76* (2006.01)
*H01L 29/94* (2006.01)
*H01L 31/00* (2006.01)
*H01B 13/00* (2006.01)

(52) U.S. Cl. ............................. 257/338; 257/E21.366; 257/E21.386; 257/E21.394; 257/E21.408; 257/E21.197; 257/E21.242; 257/E21.245; 257/E21.327; 216/13

(58) Field of Classification Search .................. 216/13; 257/338, E21.366, E21.386, E21.394, E21.408, 257/E21.197, E21.242, E21.245, E21.327
See application file for complete search history.

(56) References Cited

U.S. PATENT DOCUMENTS 5,385,865 A * 1/1995 Nieder et al. ............... 438/238

(Continued)

FOREIGN PATENT DOCUMENTS

EP   0 464 834   1/1992

(Continued)

OTHER PUBLICATIONS

S. Luscher et al., "In-plane gate single-electron transistor in Ga [A1] As fabricated by scanning probe lithography", Applied Physics Letters, American Institute of Physics, vol. 75, No. 6, Oct. 18, 1999, pp. 2452-2454.

(Continued)

*Primary Examiner*—David E. Graybill
(74) *Attorney, Agent, or Firm*—Miles & Stockbridge P.C.

(57) ABSTRACT

Diode devices with superior and pre-settable characteristics and of nanometric dimensions, comprise etched insulative lines (8, 16, 18) in a conductive substrate to define between the lines charge carrier flow paths, formed as elongate channels (20) at least 100 nm long and less than 100 nm wide. The current-voltage characteristic of the diode devices are similar to a conventional diode, but both the threshold voltage (from 0V to a few volts) and the current level (from nA to µA) can be tuned by orders of magnitude by changing the device geometry. Standard silicon wafers can be used as substrates. A full family of logic gates, such as OR, AND, and NOT, can be constructed based on this device solely by simply etching insulative lines in the substrate.

21 Claims, 10 Drawing Sheets

U.S. PATENT DOCUMENTS

| | | | | |
|---|---|---|---|---|
| 5,396,089 | A | * | 3/1995 | Wieck et al. ............... 257/192 |
| 5,444,267 | A | * | 8/1995 | Okada et al. ................. 257/14 |
| 5,485,018 | A | * | 1/1996 | Ogawa et al. ................ 257/24 |
| 5,562,802 | A | * | 10/1996 | Okada et al. ............... 438/696 |
| 5,772,905 | A | | 6/1998 | Chou ........................... 216/44 |
| 2004/0149679 | A1 | * | 8/2004 | Song et al. ................... 216/13 |

FOREIGN PATENT DOCUMENTS

| | | |
|---|---|---|
| EP | 0 604 200 | 6/1994 |
| EP | 1 251 562 | 10/2002 |
| WO | WO 02/19436 | 3/2002 |

OTHER PUBLICATIONS

J. Nieder et al., "One-dimensional lateral-field-effect transistor with tranch gate-channel insulation", Applied Physics Letters, American Institute of Physics, vol. 57, No. 25, Dec. 1990, pp. 2695-2697.

A. D. Weick et al., "In-plane-gated quantum wire transistor fabricated with directly written focused ion beams", Applied Physics Letters, American Institite of Physics, vol. 56, No. 10, Mar. 5, 1990, pp. 928-930.

* cited by examiner

Channel more open
=> large current

Fig.1D.

Charged more closed
=> little or no current

Fig.1E.

Functions like

Bridge rectifier

AND

Channel more closed
=> little or no current

NANOELECTRONIC DEVICES AND CIRCUITS

The present invention relates to nanoelectronic diode devices and circuits.

Known techniques for making integrated circuits of micrometer dimensions commonly involve multiple steps comprising overlying and aligning different shapes and patterns in e.g. photolithographic techniques, with diffusion and implantation steps. However these techniques are difficult to apply for manufacturing extremely small circuits of nanometric dimensions. With current advances in technology, complementary metal-oxide semiconductor (CMOS) field-effect transistors in microprocessors have a gate length already close to 100 nm. In order to continue the miniaturisation of the semiconductor devices, the industry faces great fabrication, technical and economic challenges. Future integrated circuits must be built with devices of nanometric dimensions based on new concepts.

Techniques for generating circuit features of nanometric dimensions on a substrate include X-ray beam and electron beam lithography. One particular technique is disclosed in U.S. Pat. No. 5,772,905, the so called nano imprint process, in which a mould having extremely small projections formed by E-beam lithography is pressed into a plastics polymer layer on a substrate so as to create depressions in the layer corresponding to the mould projections. An etching process may then be carried out to expose the substrate in the depression areas, and subsequent etching or deposition processes may be carried out to define features of an integrated circuit. However, U.S. Pat. No. 5,772,905 does not disclose a complete integrated circuit, nor a method of implementing a complete circuit.

EP-A-0464834 discloses a transistor formed in a AlGaAs/GaAs heterostructure by means of a geometric pattern of insulative trenches. A 600 m wide one-dimensional channel is insulated laterally from 2DES areas, which provide transistor gates, by 700 nm wide deep mesa etched trenches. The conductivity in the ID channel has a strict linear dependence on the applied gate voltage across the channel.

SUMMARY OF THE INVENTION

In accordance with at least a preferred form of the invention, we have discovered that positioning two insulative features close to one another such as to define a narrow elongate channel having a width dimension of the order of nanometres, provides a circuit component, wherein the current flow through the channel is a function of voltage applied across the length of channel, in a predetermined manner. In a preferred embodiment, the circuit component comprises a diode, but it may for example comprise a transistor or resistor.

The invention provides an electronic circuit component comprising a substrate supporting mobile charge carriers, insulative features formed on the substrate surface to define first and second substrate areas on either side of the insulative features, the insulative features including first and second regions which are positioned close to one another but spaced apart so as to provide an elongate channel which provides a charge carrier flow path in the substrate from the first area to the second area; and wherein said elongate channel is dimensioned and arranged such that the parameters of the charge carrier flow path are dependent on a potential difference between said first and second areas.

For the purposes of this specification, "circuit component" means a part or element of an integrated circuit which provides a desired circuit function such as a transistor, capacitor, diode or logic gate.

Where the circuit component is a non-linear device such as a diode, it is necessary to break the inversion symmetry in the charge carrier flow path. Thus the insulative regions are such that the applied voltage operates in a different way, dependent on its polarity, to open or close the channel, as described in more detail below. This provides highly asymmetric current-voltage characteristics, similar to or better than that of normal diodes.

For the purposes of the present specification, "insulative" is to be understood as a relative value, as compared to the conductivity of the substrate. In one embodiment, trenches forming insulative barriers may be weakly conductive, forming very narrow conductive channels. In some cases it is preferable to have a little conduction when no voltage is applied, which may provide very sensitive detection or mixing of very weak signals, even though a little leakage current exists.

In one preferred embodiment, the insulative features are formed as trenches or lines dividing the substrate into first and second areas. Further trenches or lines extending at an angle to the dividing lines define the channel, extending into one of the first and second areas. Electrical voltages may be applied to the first and second areas by means of appropriate electrical contacts and a voltage difference is created across the insulative dividing lines. The outer sides of the channel defining lines are exposed to its voltage in the one area. When the electrical voltage across the channel is sufficiently high, the electric field creates a depletion region in which no charge carriers exist. Provided the channel is sufficiently narrow and sufficiently long, a perfect closing or pinch off of the gap is achieved so that no, or at any rate very little, current flow is possible. Thus a diode-action is created. When the applied voltage is in the forward direction, the applied voltage will electrostatically widen the channel in addition to making the channel potential lower, which allows the carriers to flow easily in the forward direction.

The width of the channel is preferably of the order of 30 nanometres. The maximum width of channel is generally 100 nm, whereas the narrowest width of channel can extend down to close to zero. If for example an overgrowth is provided after etching of the grooves, the depletion around the etched lines is much less, and the designed channel width can be much less. The length of the channel is also determinative of the operation of the device and in order to achieve diode action, the length must be at least of the order of 100 nm for a substrate material of InGaAs/InP, while the maximum length may be a few microns or more. The lengths depend to a large extent on the material of the substrate and the purpose intended for the circuit component. Thus the present invention can provide a perfect diode action with a very simple construction. Since there are no P-N junctions creating minority carriers, the electrical characteristics of diode are very clean so that no reverse current is provided on pinch off.

In a modification, one side of the channel may be exposed to a further control or modulating voltage existing in a closed area of the substrate. This modulates current flow through the channel, and thus creates a transistor device.

The substrate may provide a two-dimensional electron gas; alternatively it may have any other desired characteristic. Any desired substrate material may be used, for example silicon or bulk SiGe material. As currently available, InGaAs/InP material is used.

Although primarily serving for electronic purposes, the devices of the invention may also be used as optical components. For example where a diode device is constructed from two insulative barriers defining a narrow elongate channel, in the condition where the channel is either almost pinched off or nearly closed, it is very sensitive to light illumination i.e. the depletion around the insulative barriers can be very much reduced. As a result even a weak light will dramatically increase the current at a certain bias by orders of magnitude. This can be directly used as a light detector or optical switch.

The diode according to the invention may alternatively be employed as a photodiode, light being generated by the avalanche effect, where electrons are generated from the valence band and leave behind a hole. Generated holes recombine with electrons and generate light.

In another embodiment, the electrical and optical parameters of the channel of the device may be made very sensitive to a small number of, even a single one, molecules of a certain type adsorbed onto the surface of the device—thus the device may be used as a sensor for such molecules.

In accordance with the invention, it is possible to make integrated circuits of nanometric dimensions in essentially a single fabrication step or at any rate a very small number of processing steps, all of which follow a single pattern of features. Any suitable method for producing etched features may be employed, including e-beam lithography and the nano-imprint method referred to above. This is greatly simplified as compared with prior art processes of making integrated circuits, involving multiple steps comprising various steps involving overlying and aligning different shapes and patterns. Nevertheless, the present invention may incorporate a subsequent step of forming a wide area gate covering multiple circuit components, without disturbing the essential simplicity of the process.

BRIEF DESCRIPTION OF THE DRAWINGS

Preferred embodiments of the invention will now be described by way of example with reference to the accompanying drawings wherein.

DESCRIPTION OF THE PREFERRED EMBODIMENTS

The roadmap of micro-electronics has long indicated that we will very soon reach the limits of conventional semiconductor devices, and near future integrated circuits must be built with nanodevices based on new concepts. Furthermore, it is highly desirable that these new nanodevices can be made on standard silicon wafers. Despite great efforts in making nanodevices working at room temperature, there is very little success. The reason is that most nanodevices proposed so far require a feature size of about a few nm.

The invention includes diode-type devices. The current-voltage characteristic of the diode-like devices is just like that of a conventional diode, but both the threshold voltage (from 0V to a few volts) and the current level (from nA to μA) can be tuned by orders of magnitude by simply changing the device geometry, with no need to change the property of the host material by doping, diffusion, etc. Better than a pn diode, the leakage current under the backward biased condition can be negligibly low. Three-terminal devices can provide both the functionality of a transistor and that of a diode, meaning great flexibility in construction of circuits. When used as a three-terminal device in a modified design, the device can exhibit both the functionality of a transistor and that of a diode, meaning great flexibility in construction of circuits.

Although currently implemented on InGaAs/InP material, the devices can be reliably and reproducibly made on standard silicon wafers, since the working principle does not rely on a high electron-mobility. As will be shown below, a full family of logic gates, such as OR, AND, and NOT, can be constructed only by simply etching grooves in the substrate. Therefore, the invention will considerably simplify the manufacture of diode-type devices as well as integrated circuits, and hence greatly reduce the production cost.

Figure 1A:
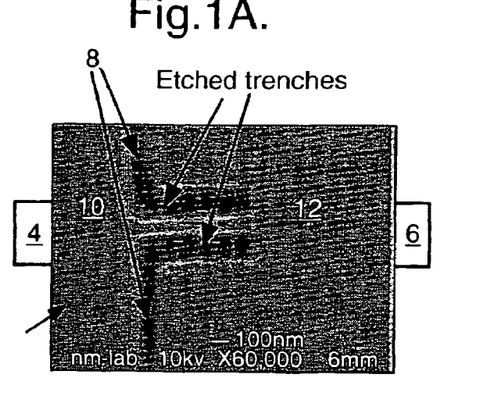
FIGS. 1A–1E show schematic views, together with a scanning electron micrograph, of a first embodiment of the invention comprising a diode.
Figure 1B:
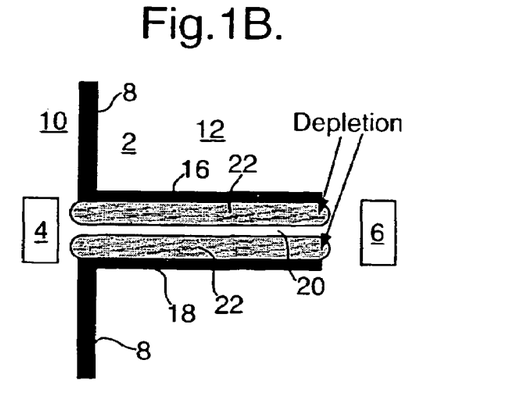
Figure 1C:
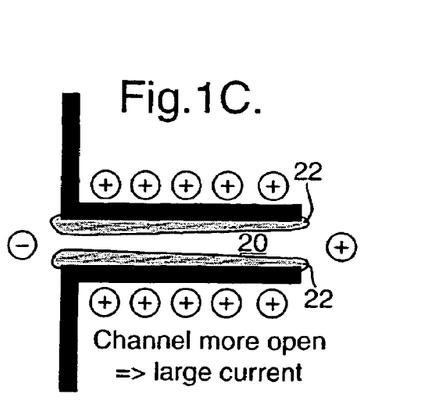
Figure 1D:
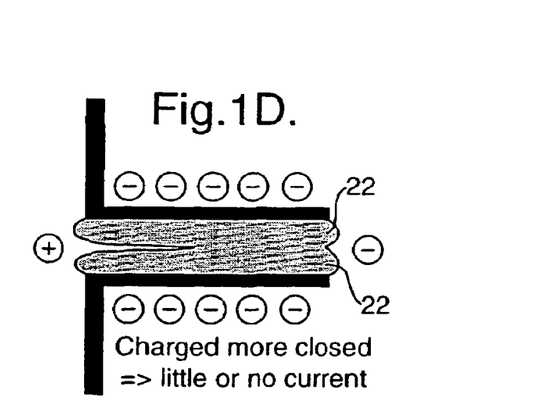
Figure 1E:
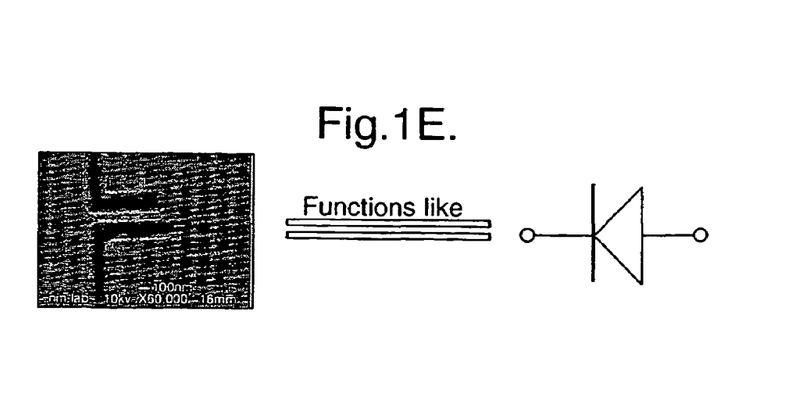

Referring now to FIG. 1, FIGS. 1A and 1E show a scanning electron microscope (SEM) image of a diode-type device. Electrical contacts 4, 6 are formed on left and right sides of the InGaAs/InP substrate 2 and a central insulative line 8 (here etched trenches) divides the substrate into left and right areas 10, 12. The width of the etched trenches are about 100 nm. To fabricate the device, we first spin a layer of electron-beam resist (ZEP-520) on the InGaAs/InP substrate, which contains a conductive (mobile electrons) layer about 50 nm below the surface. The designed pattern was then defined using electron-beam lithography. After development of the resist after the electron-beam exposure, wet chemical etching was used to make the trenches of about 100 nm deep, i.e. etching through the conductive layer and forming insulative lines.

In the centre of line 8, two line regions 16, 18 are formed extending from line 8 onto substrate area 12. Lines 16, 18 are perpendicular to the length of line 8 and having a length of about 500 nanometres. Thus, the etched trenches not only define a narrow channel but, extending only into area 12, also break the inversion symmetry along the channel current direction. The elongate channel 20 has a width of about 50 nanometres, which provides an electron flow path for mobile electrons in the substrate to travel from the left side 10 to the right side 12 of the substrate, or in the opposite direction.

In a condition where no voltage is applied to terminals 4 and 6, there will exist in channel 20 depletion regions 22 as shown in FIG. 1B adjacent each line region 16, 18 so that only a narrow area of the flow path is available for electron conduction. These depletion regions are created by reason of surface states and the Fermi level at the etched surface. The depletion regions are shown as indicating their effect on transport of electrons through the channel. As shown in FIG. 1C when a positive voltage is applied to terminal 6 and a negative voltage applied to terminal 4, a positive voltage exists on the outer sides of line regions 16, 18, and this acts to decrease the size of the depletion regions 22 by electrostatically lowering the potential in the channel. In this condition, the electron conduction and therefore the current will be large.

In FIG. 1D, when the voltage polarities are reversed so that a positive voltage is applied to terminal 4 and a negative voltage to terminal 6, the negative voltage existing on the outer sides of line regions 16, 18 electrostatically lifts the potential in the channel. This creates either a much narrower channel or even a wholly pinched off channel. In the latter case, carriers cannot penetrate from one side to the other considering the large length of channel. Thus, only little or even no current will flow through the channel, in contrast to the opposite voltage polarity, meaning that a diode-like functionality is created as shown in FIG. 1E.

Furthermore, the amount of minority carriers will be negligible as no P-N junctions are created. Therefore, the leakage current under reverse-biased condition can be extremely small and was observed experimentally to be down to below pA.

Figure 2:
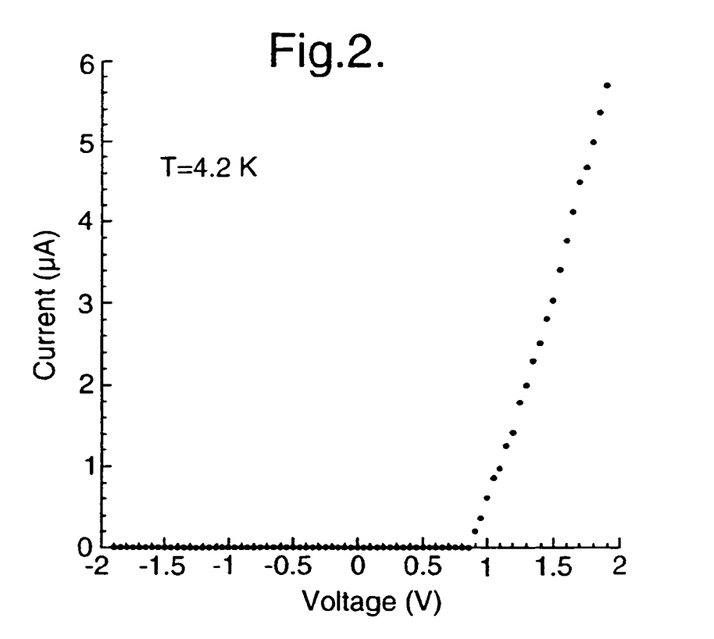
FIGS. 2–6 are graphs of experimental current-voltage characteristics of the diode-type devices shown in FIG. 1, but with characteristics altered to give different operating characteristics.

FIGS. 2–6 are graphs of experimental current-voltage characteristics of the diode-type devices shown in FIG. 1, but with characteristics altered to give different operating characteristics. FIG. 2 shows the characteristic for a device similar to FIG. 1 (but with a channel length of 700 nm and width of 40 nm). It can be seen that for a voltage above 0.9 volts created between terminals 4, 6, the current through channel 20 increases extremely rapidly so that at a voltage of 2 volts, there is a current of about 6 micro amps. Below the value of 0.9 volts, no current is observed. The characteristics are given for a temperature of 4.2° Kelvin.

Figure 3:
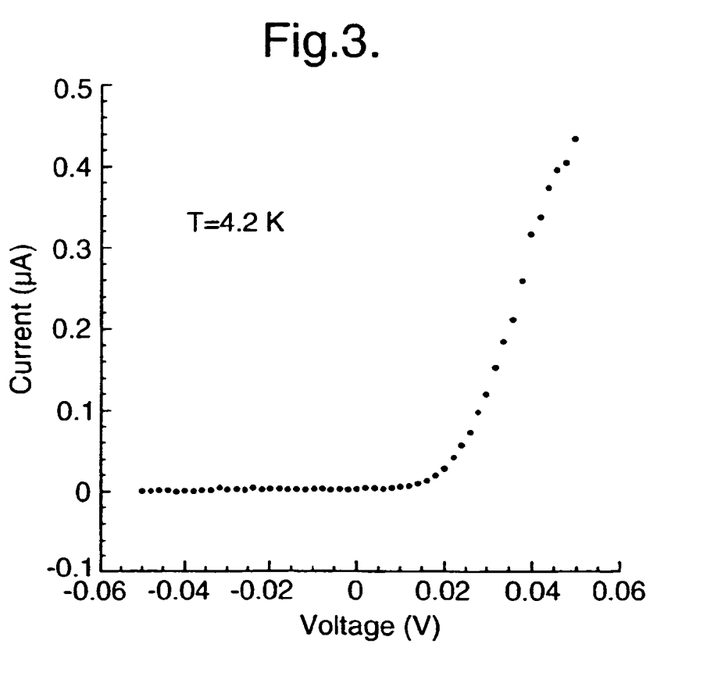

In FIG. 3, the dimensions of the elongate channel 20 are adjusted (channel length 1000 nm and width of 50 nm) so that the threshold voltage is well below 0.02 volts, i.e. very close to 0.

Figure 4:
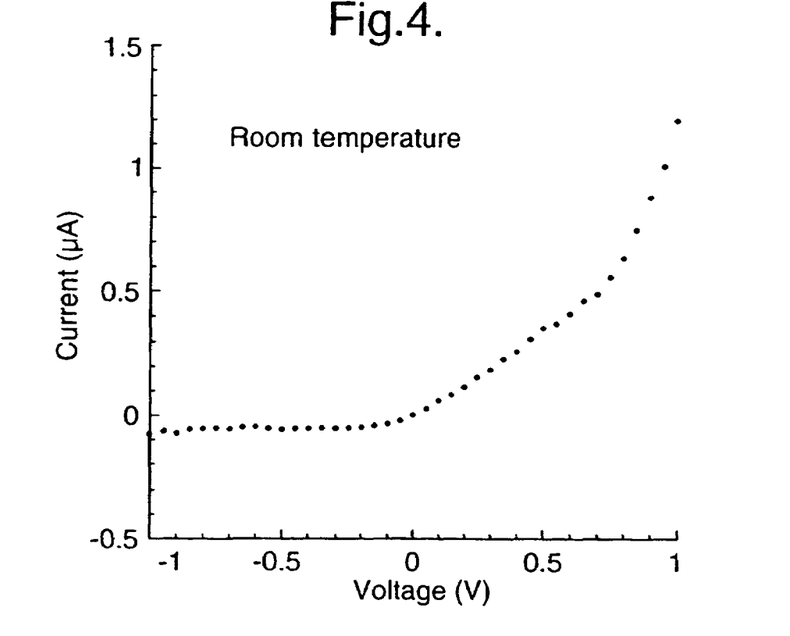

In FIG. 4, a device is shown with dimensions of the elongate channel of FIG. 3. The characteristic shown is at room temperature. A less than perfect characteristic is given with a little current under the reverse-biased condition, which can be reduced to zero by optimisations such as slightly reducing the channel width As shown below in FIGS. 10B and 10C, this less than perfect characteristic can be desirable in some logic circuits.

Figure 5:
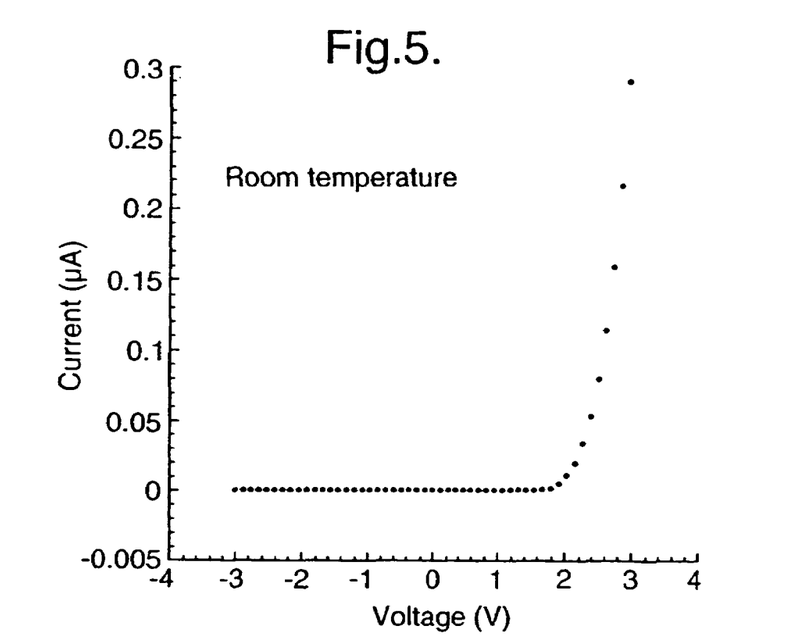

Referring to FIG. 5, the dimensions of the channel are adjusted (width 20 nm, length 700 nm) so that there is a large positive threshold voltage of about 2 volts. This characteristic is measured at room temperature.

Figure 6:
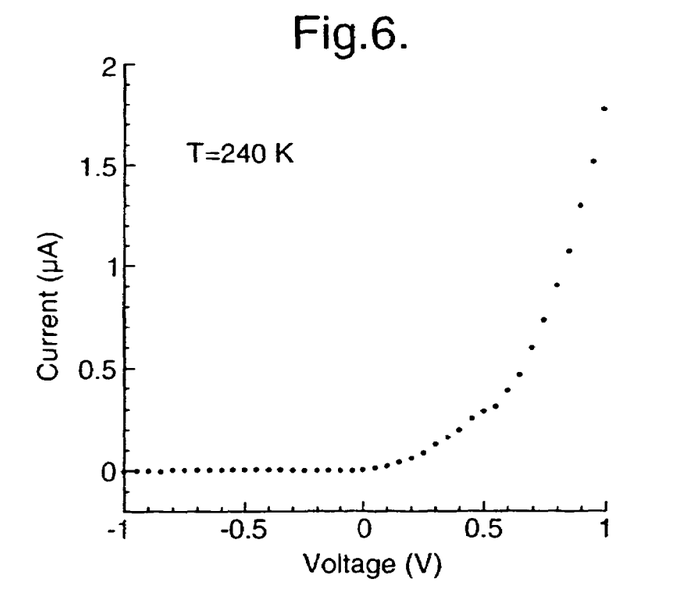

In FIG. 6, a characteristic of a device with channel dimensions of FIG. 3 is measured at a temperature of 240° Kelvin. The threshold is exactly 0 volts and there is no current under the reverse-biased condition. The characteristic is close to an ideal diode, with no noticeable leakage current and zero threshold voltage.

Referring now to FIG. 7, this shows variations in geometrical configuration of line regions 16, 18 defining elongate channel 20. In FIG. 7A the lines 16, 18 inwardly taper from lines 8 so that width of the channel 20 is at a minimum at the free ends of lines 16, 18. This has advantages in better control over current flow.

Figure 7A:
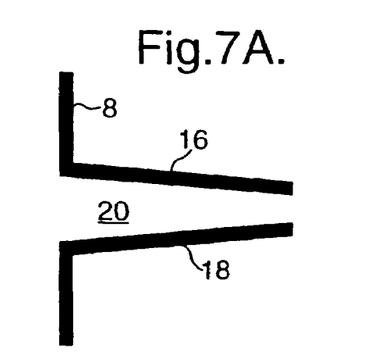
FIG. 7 is schematic views of modified forms of the diode of FIG. 1.
Figure 7B:
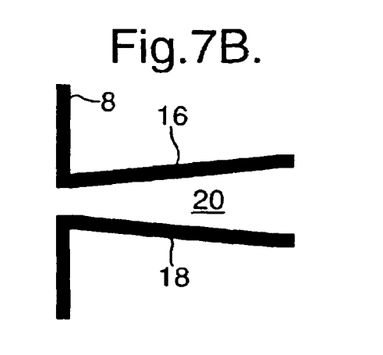

In FIG. 7B, the line regions 16, 18 taper in the opposite direction so that the width of the elongate channel 20 is at a minimum adjacent line 8 and at a maximum at the free ends of lines 16, 18.

Figure 7C:
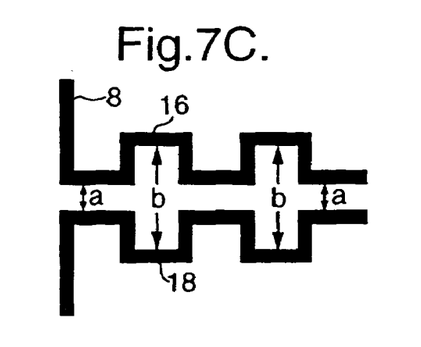

In FIG. 7C the line regions 16, 18 are castellated so that the width of the channel 20 varies between a small value a where lines 16, 18 are close to one another, and a large value b in the areas where line regions 16, 18 are far from one another. This construction may create non-linear quantum transport effects.

Figure 7D:
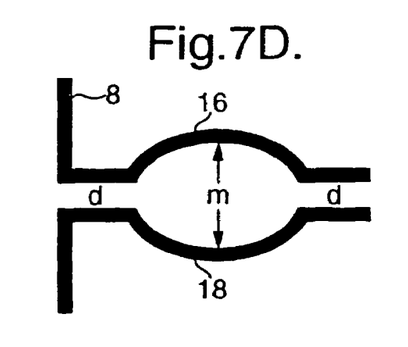

In FIG. 7D, the line regions 16, 18 outwardly curve from lines 8 relative to one another until they reach a maximum value apart m, whence the lines curve back inwardly to a width d equal to the width d at regions 8. This construction may create non-linear quantum transport effects. In all of FIG. 7, the width of the channel does not significantly exceed 100 nm.

Figure 8A:
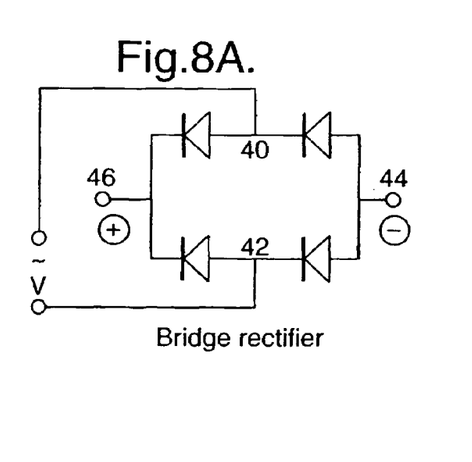
FIGS. 8A–8B show a further preferred embodiment of the invention comprising a bridge rectifier.
Figure 8B:
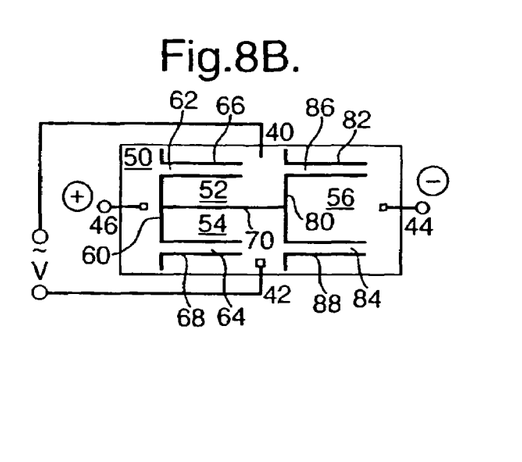

Referring now to FIGS. 8A to 8B, a second embodiment of the invention comprises a bridge rectifier, shown schematically in FIG. 8A wherein an alternating voltage is applied across terminals 40, 42 and a unipolar rectified voltage is derived at terminals 44, 46.

One implementation of this bridge rectifier is shown in FIG. 8B wherein a InGaAs/InP substrate is divided into essentially four areas 50, 52, 54, 56. These areas are separated by insulative lines, with line 60 having elongate channels 62, 64 defined by line regions 66, 68 interconnecting region 50 with regions 52 and 54. An insulative line 70 wholly separates region 52 from region 54. An insulative line 80 has line regions 82, 84 which define elongate channels 86, 88 which permit current flow between region 56 and regions 52, 54. Terminals 40, 42 are respectively connected to regions 52, 54 so that an alternating voltage exists in these regions. Terminal 46 is connected to region 50 and terminal 44 is connected to region 56.

Thus in operation with a positive phase applied to terminal 40 and a negative phase to terminal 42, current flow is encouraged through channel 62, but inhibited through channel 64. Channel 86 will be depleted since the voltage in region 56 will be negative relative to the positive voltage existing in region 52. Channel 84 however will however be opened since the voltage within region 56 will be positive relative to the large negative voltage existing in region 54. Thus current flow will be enabled through channel 62 from region 52 to region 60, resulting in a positive voltage at terminal 46. Current flow will enabled through channel 84 from region 56 to region 54, resulting in a negative voltage at terminal 44.

When the polarities at terminals 40, 42 are reversed, and a negative voltage is applied to region 52, together with a positive voltage applied to region 54, then in a similar manner to the above, channel 64 will be open to provide current flow between region 54 and region 50 to create a positive voltage at terminal 46. Channel 86 will be opened to enable current flow between region 52 and region 56, to create a negative voltage at terminal 44. Thus a full wave rectification action is provided.

Thus channel 62 defined by the insulative lines corresponds to the upper left diode in FIG. 8A. Similarly, channel 86 corresponds to the upper right diode, channel 64 corresponds to the lower left diode, and channel 84 corresponds to the lower right diode in FIG. 8A. Thus, solely by fabrication of insulative lines, the bridge rectifier circuit is constructed. This shows that the invention substantially simplifies the design and manufacture of both devices and circuits, and hence greatly reduce the production cost.

Figure 9A:
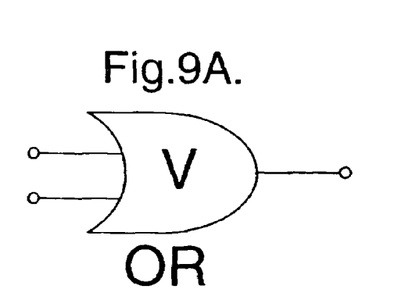
FIGS. 9A–9C show a further preferred embodiment of the invention comprising an OR gate.
Figure 9B:
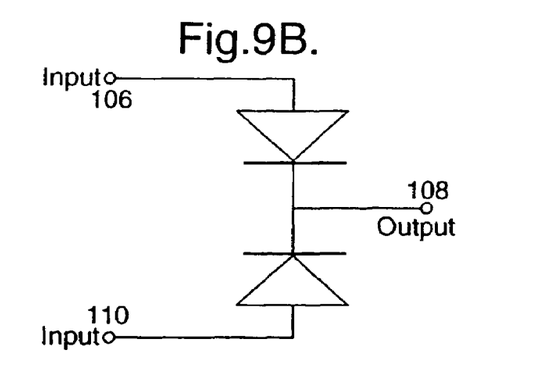
Figure 9C:
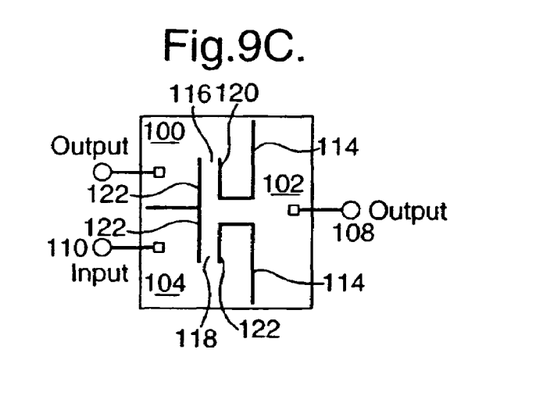

Referring now to FIG. 9, an OR gate is constructed solely by fabrication of insulative lines on a conductive circuit. FIG. 9B shows an equivalent circuit. In FIG. 9C, an OR gate facility is provided by dividing a substrate into three areas, 100, 102, 104, each with a respective terminal 106, 108, 110. The substrate regions are created by insulative lines 112, 114, and elongate flow path channels 116, 118 are created between regions 100 and 102 and 104 and 102 by insulative line regions 120, 122.

In operation when a positive voltage is applied to either of terminals 106 and 110, the respective flow channel 116, 118 will be opened enabling current flow and for the positive voltage to be transmitted to the output terminal 108. In the situation where negative voltages are applied to both of terminals 106, 110, neither voltage will be transmitted through channels 116, 118 and therefore the output voltage at terminal 108 will remain low. It is clear that channel 116 in FIG. 9C corresponds to the upper diode in FIG. 9B, while the channel 118 corresponds to the other diode. In operation when a positive voltage is applied to either of terminals 106 and 110, the respective channel 116, 118 will be opened enabling current flow and for the positive voltage to be transmitted to the output terminal 108. In the situation where a logic LOW voltage is applied to both of terminals 106, 110, the output at terminal 108 will remain low.

Figure 10A:
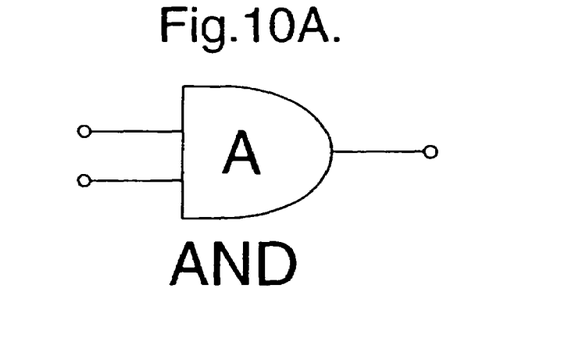
FIGS. 10A–10C show a further preferred embodiment of the invention comprising an AND gate.
Figure 10B:
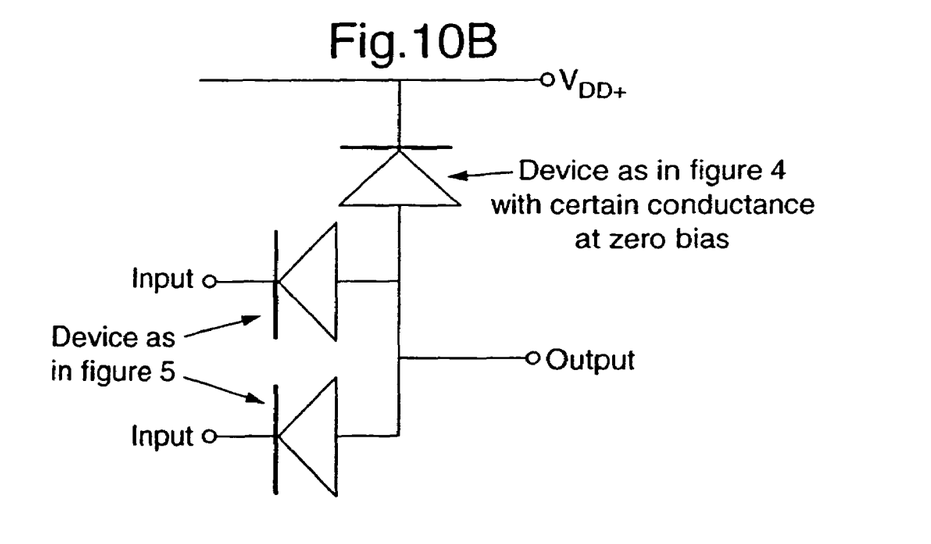
Figure 10C:
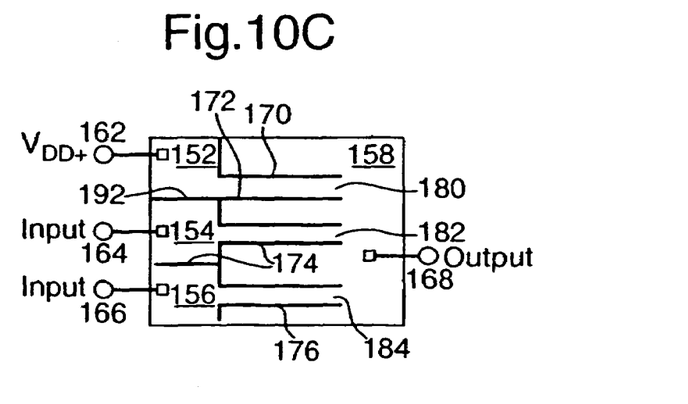

Referring now to FIG. 10A, an AND gate facility is provided. FIG. 10B shows an equivalent circuit. In FIG. 10C, an AND gate facility is provided by dividing a substrate into four areas, 152–158, each with a respective terminal 162–168. The substrate regions are created by insulative lines 170–176, and elongate flow path channels 180–184 are created, which define diodes. Note that channel 180 is slightly wider than channels 182 and 184 such that channel 180 provides a characteristic like that in FIG. 4 with a certain conductance at a low bias voltage while channels 182 and 184 provide a characteristic like that in FIG. 5 and, for the best, provide an "ideal" characteristic as in FIG. 6. In operation, a positive rail voltage is applied to terminal 162. When logic HIGH voltages are applied both to terminals 164, 166, the diodes 182, 184 are reverse-biased, and the positive rail voltage is transmitted through channel 180 to output terminal 168. When either of input terminals 164, 166 has a logic LOW voltage applied, the respective diode becomes forward-biased and has only a little voltage drop over it since the diode 180 is reverse-biased and has a very large resistance. As a result, the voltage at the output terminal will be a logic LOW signal. Thus an AND function is provided. This circuit may employ NDR, as described below with reference to FIG. 12B for reaching zero current.

Figure 11A:
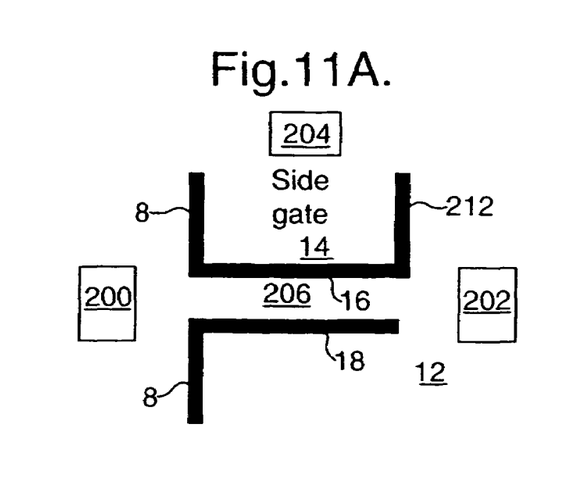
FIGS. 11A–11B shows a further preferred embodiment of the invention comprising a diode-type device with a tuneable threshold, which can also function as a transistor-type device.
Figure 11B:
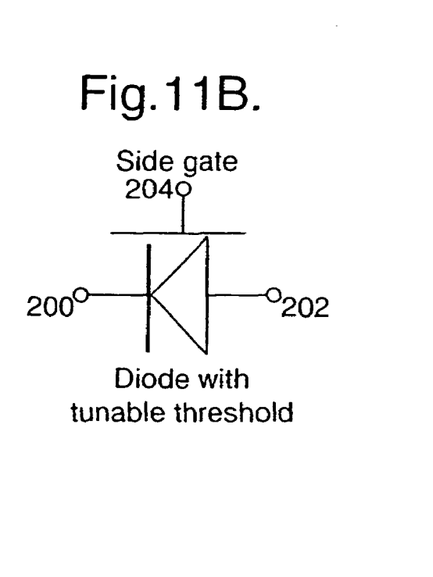

Referring now to FIG. 11A, a three-terminal transistor device is shown. The design is based on the design of FIG. 1B, and similar paths are indicated by the same reference numeral.

An insulative line 8 divides the substrate into a left area 10 and a right area 12, which have respective electric contacts 200, 202. Insulative lines 16, 18 extending perpendicularly to line 8 define a narrow channel 206 extending between areas 10 and 12. In addition a further insulative line 212 extends from the free end of line 16 parallel to line 8 in order to define a further substrate area 14. This area has a further electrical contact 204. Thus an extra insulative line 212 defines a side gate region 204. The side gate terminal 204 is similar to the gate of a conventional field-effect transistor (FET). At a given voltage applied to the side gate, measurement between terminals 200 and 202 still shows a diode-like characteristic. However, by varying the voltage on the side gate, the threshold voltage of the diode (between terminals 200 and 202) is tuned. Therefore, the device can be regarded as a diode with a tuneable threshold, which can be represented by the symbol in FIG. 1B.

Since the conductance and hence the current of the channel 206 can be greatly tuned by applying a voltage on the side gate, the device also has the functionality of a field effect transistor. This enables the design of, for example, a whole family of logic gates including NOT, NAND, NOR, XOR gates, etc., with high efficient and low power consumption. A NOT or inversion capability is provided by inversion of voltage at 204 at the output terminal. The combination of a diode element and transistor element provides buffer elements for logic circuits, and enables cascading for larger circuits. The devices and gates are NMOS in nature, as opposed to CMOS which is currently used: hence low power consumption.

Figure 12:
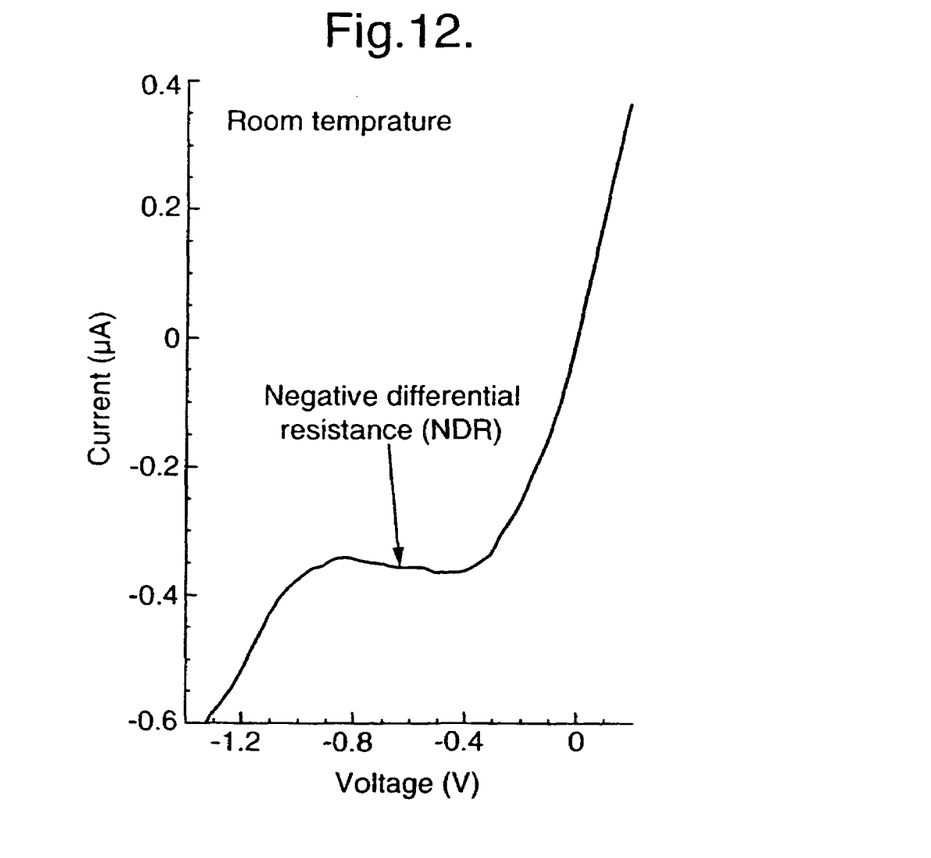
FIG. 12 shows a negative differential resistance (NDR) characteristic of a preferred embodiment of the invention.

Referring to FIG. 12, there is shown that for certain dimensions of channel (here length 1 micron, width 50 nm), a pronounced negative differential resistance (NDR) characteristic is exhibited under the reverse-biased condition at room temperature. In other words, in a certain voltage range an increasing of applied voltage results in a reduced current. NDR devices are widely used as the central elements in high-speed electronic oscillators. The speed of oscillation may be 100's of GHz, even THz.

Figure 13:
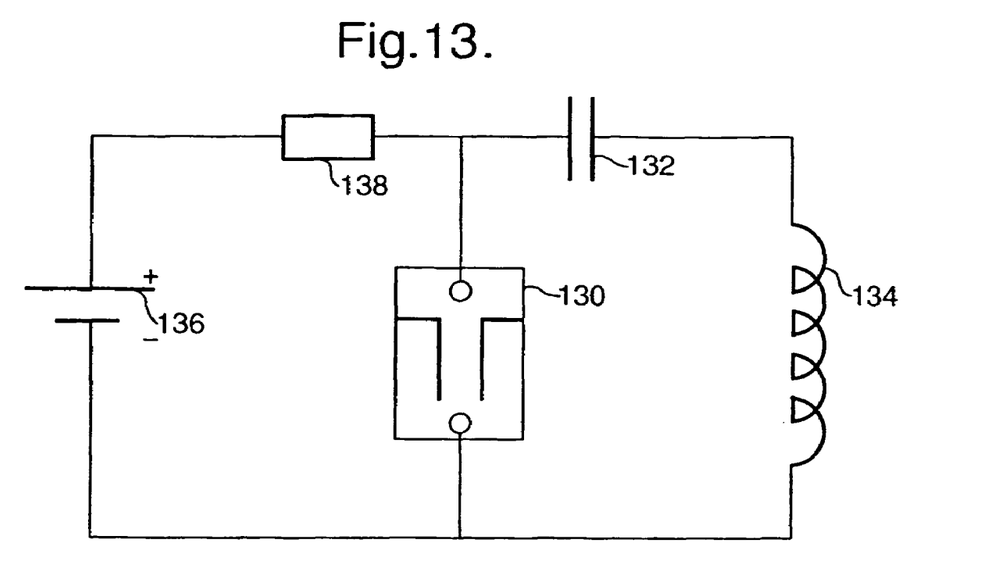
FIG. 13 is a schematic circuit diagram of a GHz oscillator employing the device of FIG. 12.

An oscillator circuit based on a NDR device is shown in FIG. 13. A diode 130, of the form shown in FIG. 1, is connected in parallel with a capacitor 132 and inductor 134. A voltage source 136 provides power. Oscillatory signals are generated across load 138 and the diode. In the case when the oscillator operates at very high frequencies, the generated microwave can be radiated directly from the surface of the device. This is useful in VHF, UHF as well as in GHz regimes, and one such example is as a 40 GHz switch for photonics applications.

Figure 16:
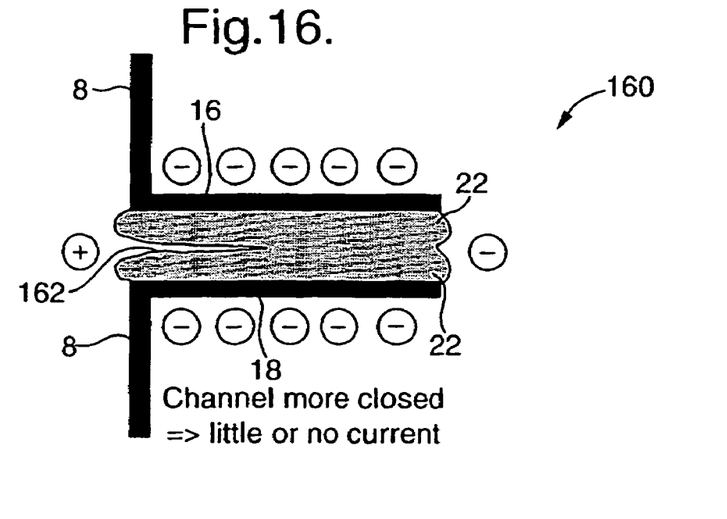
FIG. 16 is a schematic view of a further embodiment of the invention, comprising a photodiode.

Referring to FIG. 16, a photodiode 160 forming a further embodiment of the invention is shown schematically, similar parts to these of FIG. 1 being denoted by the same reference numeral. The photodiode employs the avalanche effect, which occurs in a reverse-biased condition and where electrons are generated from the valence band and leave behind holes. Generated holes recombine with electrons and generate light. The avalanche effect normally occurs when electric field is very localised, and the diode produces a very localised field along the channel direction at one end of the channel. The intensity of the field in region 162 is sufficiently great that electrons leaving the valence band collide with other electrons, forcing these electrons also to leave the valence band; holes undergo a similar process; hence the avalanche effect.

Figure 14:
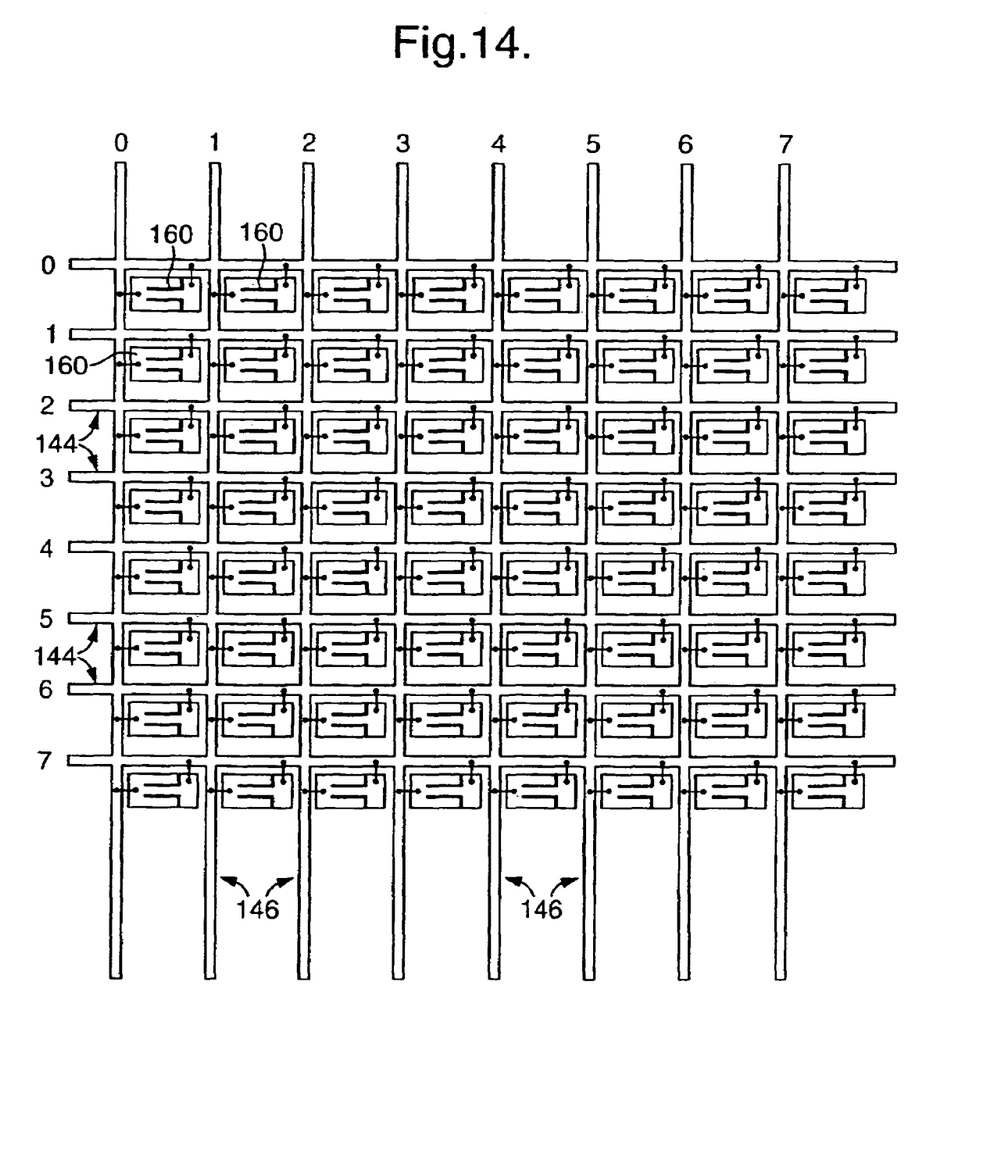
FIGS. 14 and 15 are schematic views of the embodiment of FIG. 16 incorporated into scanning matrices.

FIG. 14 is a schematic view of a rectangular matrix of elements, each element comprising a photodiode 160 as shown in FIG. 16. The photodiodes are addressed by row address lines 144 and column address lines 146. This provides a randomly accessed light-emitting source array with the advantages of easy and cheap fabrication as well as easy integration, very large arrays are practical. Whilst a drawback is the possible low efficiency of light generation, in those cases when this is not a big problem whereas production cost or integration density are the main issues, this is a practical option. The advantage of FIG. 14 is ease of identification of individual photodiodes, and individual row and column address lines.

Figure 15:
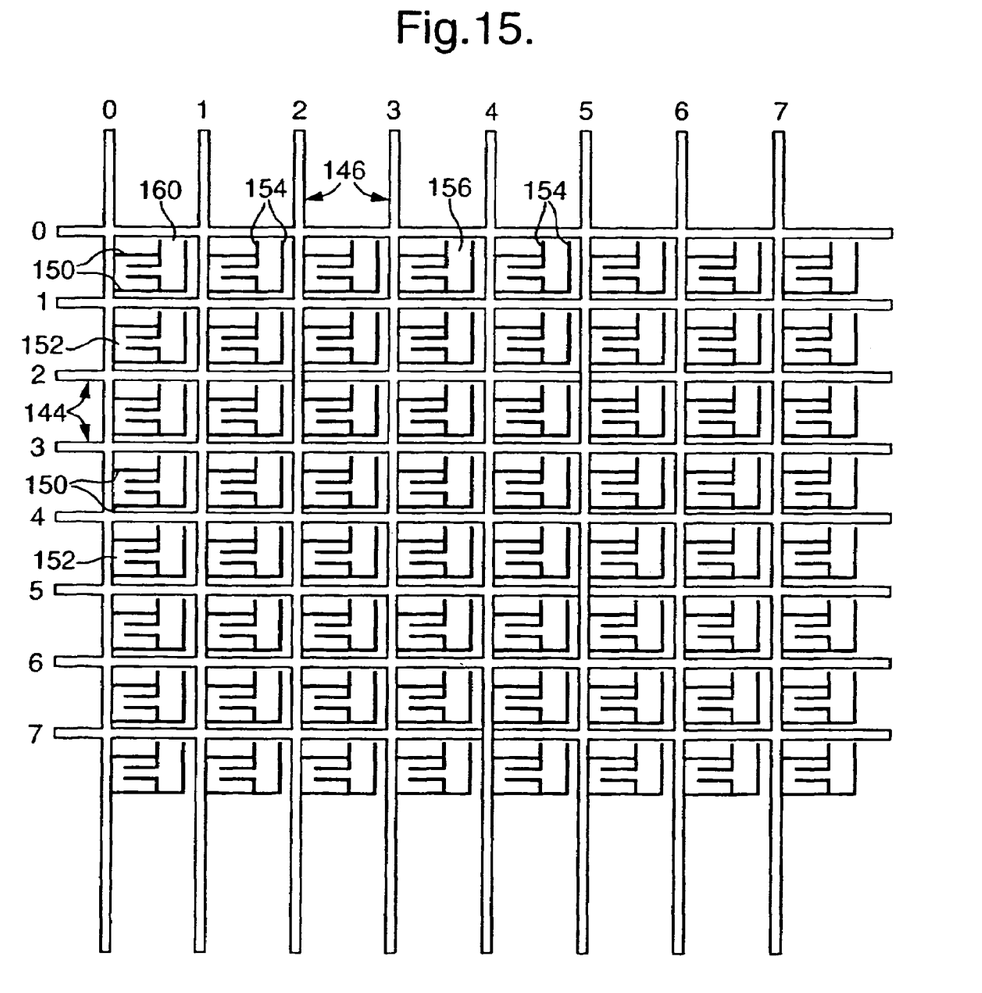

FIG. 15 represents a more practical version of FIG. 14, where the electrical connections of each photodiode 160 are integrated with address lines 144, 146. Thus each photodiode element has insulative trenches 150 extending towards an associated column address line 146, to provide electrical connection thereto via substrate region 152. Each photodiode element has insulative trenches 154 extending towards an associated row address line 144, to provide electrical connection thereto via substrate region 156.

In FIGS. 14 and 15, the address lines may be of metal or of a semiconductor material, the same material as the substrate 2 of each diode.

Since, as discussed above the individual devices are very sensitive light because of the narrow channel and the dominant role of the surface on the side of the channel, such an array would also be useful for light detection with high spatial resolution. Also it can be used when immersing in a solution, to detect spatial distribution of e.g. molecular concentration.

Given the examples above, the devices and circuits of the invention have a number of obvious advantages from device, material, and circuit points of view.

Device Point of View
Compared with a conventional diode, the new device concept has a number of obvious advantages, such as
Simple: making devices by just writing lines (or trenches) as shown in FIG. 1a,
Cheap: only one fabrication step needed, no multiple-mask alignments, and therefore suitable for using, e.g., nano-imprint technique,
Can be reproducibly made: The device feature size can be designed to be larger than 30 or 50 nm, so it can be made reproducibly and reliably.
Good device/feature size for next 10 to 20 years: The device feature size is between 10 to 100 nm, and the device size from about 50 to 1000 nm. Hence, it meets the requirements for the next generation of logic ICs as predicted by "International Technology Roadmap for Semiconductors".

Material Point of View
Since the working principle does not require a high electron-mobility, SSDs can be readily made on standard silicon wafers, or other materials such as Ge, GaAs, InP, InAs.

Circuit Point of View
Making circuits in one step: The above shows some of the examples where dark lines are e.g. etched trenches, including a) bridge rectifier, where by applying an AC voltage to the upper and lower terminals a DC voltage is generated between the left and right terminals, b) logic OR, in which if any of the left two input terminals is applied with a logic high voltage, the output will have a logic high output. In both cases, devices as well as circuits are made by just writing/etching lines in one fabrication step, rather than making dopings or gatings, etc. in multiple steps requiring precise alignments.
Complete logic family: Other logic elements such as AND and NOT have been designed. Therefore, a new, complete family of logic elements can be made. Based on these basic logic building-blocks, one can in principle construct fully functioning, Si-based, logic circuits like adders. Another noticeable advantage is that the logic voltage level can be easily tuned to meet that of, for example, the standard CMOS circuits.
Extremely low heating and power consumption: The device uses a nano-channel and hence has low current levels. Experimentally we have tuned the current level down to much less than nA simply by changing the channel width. It has been expected that in 2014, a typical microprocessor will consist of $4 \times 10^9$ logic elements. Even with our current initial devices, the total power consumption is less than 10 W, much lower than expected/required 183 W.

The invention claimed is:

1. An electronic circuit component comprising a substrate supporting mobile charge carriers, insulative features formed on the substrate surface to define first and second substrate areas on either side of the insulative features, the insulative features including first and second regions which are positioned close to one another but spaced apart so as to provide an elongate channel extending between the first and second substrate areas, which provides a charge carrier flow path in the substrate from the first area to the second area, and
wherein said elongate channel is of predetermined width such that when a voltage difference is applied between said first and second substrate areas such as to cause flow of said mobile charge carriers through said elongate channel, the voltage existing in the second substrate area influences, via said insulative features, the size of depletion regions existing within said elongate channel, whereby the conductivity characteristics of the channel are dependent on said voltage difference.

2. A component according to claim 1, wherein the circuit component comprises a diode.

3. A component according to claim 1, wherein the length of the elongate channel is at least about 100 nanometres.

4. A component according to claim 1, wherein the width of the elongate channel is less than 500 nm.

5. A component according claim 1, wherein the insulative features are defined by first insulative lines separating said first and second substrate areas, and second insulative lines extending at an angle to the first insulative lines and defining said elongate channel.

6. A component according to claim 1, wherein the elongate channel extends into only one of the first and second substrate areas so that said first and second regions are exposed to a voltage existing in the one area.

7. A full wave rectifier circuit, wherein a substrate is divided by insulative lines into at least four areas each having a respective electrical terminal, and elongate channels are selectively provided in said insulative lines between said four areas in order to create diodes, each diode being as claimed in claim 2, for providing a full wave rectification action.

8. An OR gate circuit, wherein a substrate is divided into at least three regions by insulative lines, a first region providing a first input terminal, a second region providing a second input terminal, and a third region providing an output terminal;
a first elongate channel is provided between said first region and said third region, a second elongate channel is provided between said second region and said third region, each channel providing a diode according to claim 2,
whereby to enable current flow between the regions upon application of appropriate voltages to the input terminals, whereby to obtain at the output terminal an output voltage reflecting an OR characteristic.

9. An AND gate circuit, wherein a substrate is divided into at least first, second and third regions by insulative lines, a first region providing a first input terminal, a second region providing a second input terminal, and a third region providing an output terminal;
and a first elongate channel is provided between the first region and the third region, and a second elongate channel is provided between the second region and the third region, each channel providing a diode according to claim 2;
whereby to enable current flow between the regions upon application of appropriate voltages to the first and second inputs, whereby to obtain at the output an output voltage reflecting an AND characteristic.

10. A circuit according to claim 9, including a fourth substrate region serving as a voltage rail and connected to said third region by an elongate channel providing a component according to claim 1 and serving as a resistor.

11. A component according to claim 1, wherein the elongate channel is such that a negative differential resistive characteristic is provided.

12. An oscillator circuit, including one or more reactors, and a component according to claim 11.

13. A component according to claim 2 formed as a photodiode, wherein the dimensions of said channel are such as to create a region wherein avalanche breakdown occurs upon application of voltage such as to generate light.

14. A matrix array for light emission, comprising row and column address lines, wherein each element of the matrix is a photodiode according to claim 13.

15. A component according to claim 2, arranged such as to generate a detectable current when exposed to light or to a molecular species in solution.

16. A matrix array for light detection, comprising row and column address lines, wherein each element of the matrix is a component according to claim 15.

17. A component according to claim 2, wherein the length of the elongate channel is at least about 100 nanometres.

18. A component according to claim 2, wherein the elongate channel is such that a negative differential resistive characteristic is provided.

19. An oscillator circuit, including one or more reactors, and a component according to claim 18.

20. A component according to claim 1, wherein the width of the elongate channel is less than 100 nm.

21. A component according to claim 1, wherein the width of the elongate channel is about 30 to 50 nm.

* * * * *

UNITED STATES PATENT AND TRADEMARK OFFICE
CERTIFICATE OF CORRECTION

PATENT NO. : 7,224,026 B2 Page 1 of 1
APPLICATION NO. : 10/475347
DATED : May 29, 2007
INVENTOR(S) : Aimin Song and Pär Omling It is certified that error appears in the above-identified patent and that said Letters Patent is hereby corrected as shown below:

On the Title Page:

Item (75) should read as follows:

(75) Inventors: Aimin Song, Manchester (GB); Pär Omling, Lund (SE)

Signed and Sealed this

Fourth Day of December, 2007

JON W. DUDAS
*Director of the United States Patent and Trademark Office*